(12) United States Patent
Tang et al.

(10) Patent No.: US 12,155,378 B2
(45) Date of Patent: Nov. 26, 2024

(54) CIRCUIT AND METHOD

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: Zhen Tang, Hsinchu (TW); Lei Pan, Hsinchu (TW); Miranda Ma, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 0 days.

(21) Appl. No.: 18/128,664

(22) Filed: Mar. 30, 2023

(65) Prior Publication Data
US 2023/0238953 A1    Jul. 27, 2023

Related U.S. Application Data

(63) Continuation of application No. 17/370,610, filed on Jul. 8, 2021, now Pat. No. 11,626,872, which is a continuation of application No. 16/925,195, filed on Jul. 9, 2020, now Pat. No. 11,075,625.

(30) Foreign Application Priority Data

Jun. 11, 2020    (CN) .......................... 202010527467.7

(51) Int. Cl.
*H03K 17/16*    (2006.01)
*H03K 5/12*    (2006.01)
*H03K 17/14*    (2006.01)
*H03K 17/687*    (2006.01)
*H03K 19/0175*    (2006.01)

(52) U.S. Cl.
CPC ............. *H03K 17/166* (2013.01); *H03K 5/12* (2013.01); *H03K 17/14* (2013.01); *H03K 17/687* (2013.01)

(58) Field of Classification Search
None
See application file for complete search history.

(56) References Cited

U.S. PATENT DOCUMENTS

| 6,359,484 B1 | 3/2002 | Ajit |
| 6,559,676 B1 | 5/2003 | Tomita |
| 7,449,913 B1 | 11/2008 | Hung |

(Continued)

*Primary Examiner* — Kenneth B Wells
(74) *Attorney, Agent, or Firm* — Hauptman Ham, LLP

(57) ABSTRACT

In a method of operating a circuit, at a beginning of a first edge of a driving signal, a first transistor is turned ON to pull, at a first changing rate, a voltage of the driving signal on the first edge from a first voltage toward a second voltage. Then, in response to the voltage of the driving signal on the first edge reaching a threshold voltage between the first voltage and the second voltage, the first transistor is turned OFF and an output circuit is caused to start a second edge of an output signal in response to the first edge of the driving signal. The second edge has a slew rate corresponding to a second changing rate of the voltage of the driving signal on the first edge from the threshold voltage toward the second voltage. The second changing rate is smaller than the first changing rate.

20 Claims, 7 Drawing Sheets

(56) References Cited

U.S. PATENT DOCUMENTS

| | | |
|---|---|---|
| 7,471,113 B1 | 12/2008 | Lim |
| 7,786,778 B1 | 8/2010 | Mannoorittathu et al. |
| 9,831,875 B2 | 11/2017 | Reddy |
| 11,626,872 B2 * | 4/2023 | Tang .................. H03K 5/12 |
| | | 327/384 |

* cited by examiner

CIRCUIT AND METHOD

PRIORITY CLAIM

The present application is a continuation application of U.S. patent application Ser. No. 17/370,610, filed Jul. 8, 2021, now U.S. Pat. No. 11,626,872, issued Apr. 11, 2023, which is a continuation application of U.S. patent application Ser. No. 16/925,195, filed Jul. 9, 2020, now U.S. Pat. No. 11,075,625, issued Jul. 21, 2021, which claims priority to the China Patent Application No. 202010527467.7, filed Jun. 11, 2020. The above-listed patents and applications are incorporated herein by reference in their entireties.

BACKGROUND

As integrated circuit (IC) technologies advance, speeds of ICs are increased. The increasing speeds are associated with faster switching ON/OFF at one or more circuits in an IC. The faster switching ON/OFF potentially results in issues such as SSO (Simultaneous Switching Output) noise, crosstalk between adjacent signals, EMI (Electromagnetic Interference), or the like. Such potential issues are addressed in some situations by slew rate control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
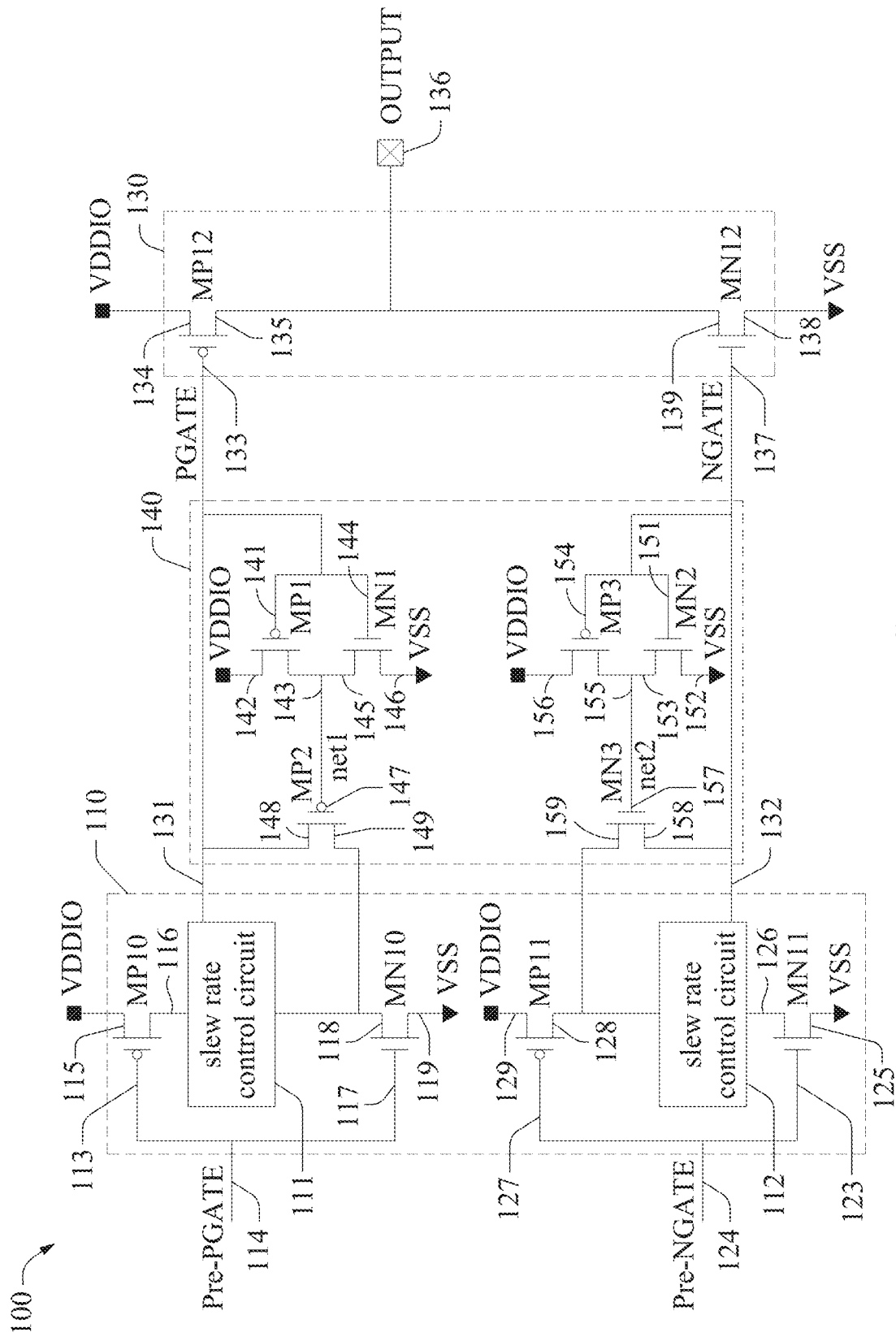
FIG. 1A is a schematic circuit diagram of a circuit for slew rate control, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As described above, faster switching ON/OFF potentially results in issues such as SSO noise, crosstalk between adjacent signals, EMI, or the like. In some situations, one or more of these issues are mitigated by slowing down a driving signal input to an output circuit that generates an output signal, so that a slew rate of the output signal is controllably decreased. A controlled decrease of the slew rate of the output signal is referred to as slew rate control, and a method of achieving slew rate control includes slowing down the driving signal as described. The slowing down of the driving signal, in some situations, has the undesirable consequence of increasing a propagation delay of the output signal relative to the driving signal.

To reduce the propagation delay, in some embodiments, at a beginning of a first edge of the driving signal, a compensation circuit is enabled to speed up switching (e.g., turning ON or OFF) of a transistor in the output circuit to start a corresponding second edge of the output signal. When the transistor in the output circuit is switched (e.g., turned ON or OFF) and the second edge of the output signal starts to rise or fall, the compensation circuit is disabled. Thereafter, a slew rate of the second edge of the output signal is controlled by a changing rate of a voltage on the first edge of the driving signal. As result, in at least one embodiment, the propagation delay between the beginnings (or starts) of the corresponding first and second edges of the driving signal and output signal, respectively, is reduced compared to other approaches where a compensation circuit is not provided. The shorter propagation delay further ensures speed performance as designed, in at least one embodiment. Because the compensation circuit is disabled when the second edge of the output signal starts to rise or fall, the slew rate control of the output signal is achievable as designed, without being affected by the compensation circuit, in at least one embodiment. In some embodiments, a beginning of an edge of a signal is the start of the edge where the signal begins to fall or rise from a maximum or minimum voltage level of the signal. In some embodiments, the maximum or minimum voltage level of the signal is within a given period.

FIG. 1A is a schematic circuit diagram of a circuit 100 for slew rate control, in accordance with some embodiments. The circuit 100 comprises a driver circuit 110, an output circuit 130, and a compensation circuit 140. Example circuitry described herein includes one or more transistors of a first type, e.g., p-channel metal-oxide semiconductor (PMOS) transistors, and one or more transistors of a second type, e.g., n-channel metal-oxide semiconductor (NMOS) transistors. In at least one embodiment, NMOS transistors are referred to as transistors of the first type, and PMOS transistors are referred to as transistors of the second type. In the drawings, PMOS transistors are labelled as "MP" and NMOS transistors are labelled as "MN." Other types of transistors or switching devices are within the scopes of various embodiments.

In the example configuration in FIG. 1A, the driver circuit 110 comprises a transistor MP10, a transistor MN10, a transistor MP11, a transistor MN11, a first slew rate control circuit 111, and a second slew rate control circuit 112. Transistor MP10 comprises a gate terminal 113 coupled to a first input 114 to receive a first input signal pre-PGATE (hereinafter "pre-PGATE"), a first terminal 115 coupled to a first power supply voltage VDDIO (hereinafter "VDDIO"), and a second terminal 116. Transistor MN10 comprises a gate terminal 117 coupled to the first input 114 to receive pre-PGATE, a first terminal 118, and a second terminal 119 coupled to a second power supply voltage VSS (hereinafter "VSS"). Transistor MN11 comprises a gate terminal 123 coupled to a second input 124 to receive a second input signal pre-NGATE (hereinafter "pre-NGATE"), a first terminal 125 coupled to VSS, and a second terminal 126. Transistor MP11 comprises a gate terminal 127 coupled to the second input 124 to receive pre-NGATE, a first terminal 128, and a second terminal 129 coupled to VDDIO. In at least one embodiment, VDDIO is a positive power supply voltage, and VSS is the ground voltage. In at least one embodiment, pre-PGATE is an inverted signal of pre-NGATE.

The circuit 100 further comprises a first connection 131 and a second connection 132. The first connection 131 couples the driver circuit 110 to the output circuit 130, and supplies a first driving signal PGATE (hereinafter "PGATE") generated by the driver circuit 110 to the output circuit 130. The second connection 132 couples the driver circuit 110 to the output circuit 130, and supplies a second driving signal NGATE (hereinafter "NGATE") generated by the driver circuit 110 to the output circuit 130. The driver circuit 110 is configured to generate PGATE from pre-PGATE. For example, when pre-PGATE is at a low level, e.g., VSS, transistor MP10 is turned ON, transistor MN10 is turned OFF, and a voltage of PGATE on the first connection 131 rises toward VDDIO via the turned ON transistor MP10. When pre-PGATE is at a high level, e.g., VDDIO, transistor MP10 is turned OFF, transistor MN10 is turned ON, and the voltage of PGATE on the first connection 131 falls toward VSS via the turned ON transistor MN10. Similarly, the driver circuit 110 is configured to generate NGATE from pre-NGATE. For example, when pre-NGATE is at a low level, e.g., VSS, transistor MP11 is turned ON, transistor MN11 is turned OFF, and a voltage of NGATE on the second connection 132 rises toward VDDIO via the turned ON transistor MP11. When pre-NGATE is at a high level, e.g., VDDIO, transistor MP11 is turned OFF, transistor MN11 is turned ON, and the voltage of NGATE on the second connection 132 falls toward VSS via the turned ON transistor MN11.

The first slew rate control circuit 111 is coupled to the first connection 131 to control a changing rate, or speed, at which the voltage of PGATE varies between VSS and VDDIO over time. Similarly, the second slew rate control circuit 112 is coupled to the second connection 132 to control a changing rate, or speed, at which the voltage of NGATE varies between VSS and VDDIO over time. Example circuitry of the first slew rate control circuit 111 and the second slew rate control circuit 112 is described with respect to FIGS. 2-3. The configuration in FIG. 1 in which the first slew rate control circuit 111 is coupled between the terminals 116, 118 of transistor MP10 and transistor MN10, respectively, is an example. In at least one embodiment, for example, as described with respect to FIG. 2, the terminals 116, 118 of transistor MP10 and transistor MN10, respectively, are directly coupled to each other. In at least one embodiment, for example, as described with respect to FIG. 3, the terminals 116, 118 of transistor MP10 and transistor MN10, respectively, are coupled to each other via a component, e.g., a resistor, of the first slew rate control circuit 111. Similarly, the configuration in FIG. 1 in which the second slew rate control circuit 112 is coupled between the terminals 126, 128 of transistor MN11 and transistor MP11, respectively, is an example. In at least one embodiment, for example, as described with respect to FIG. 2, the terminals 126, 128 of transistor MN11 and transistor MP11, respectively, are directly coupled to each other. In at least one embodiment, for example, as described with respect to FIG. 3, the terminals 126, 128 of transistor MN11 and transistor MP11, respectively, are coupled to each other via a component, e.g., a resistor, of the second slew rate control circuit 112. Other configurations for coupling the first slew rate control circuit 111 and/or the second slew rate control circuit 112 to other components of the driver circuit 110 are within the scopes of various embodiments.

In the example configuration in FIG. 1A, the output circuit 130 comprises a transistor MP12 and a transistor MN12, which are referred to as "post-drivers," in at least one embodiment. Transistor MP12 comprises a gate terminal 133 coupled to the first connection 131 to receive PGATE, a first terminal 134 coupled to VDDIO, and a second terminal 135 coupled to an output node 136 where an output signal OUTPUT (hereinafter "signal OUTPUT") is to be outputted. Transistor MN12 comprises a gate terminal 137 coupled to the second connection 132 to receive NGATE, a first terminal 138 coupled to VSS, and a second terminal 139 coupled to the output node 136. The output circuit 130 is configured to generate signal OUTPUT in response to PGATE and NGATE. Further, as described herein, the changing rate of the voltage of PGATE corresponds to a slew rate of an edge of signal OUTPUT generated by the output circuit 130, and the changing rate of the voltage of NGATE corresponds to a slew rate of another edge of signal OUTPUT.

In the example configuration in FIG. 1A, the compensation circuit 140 comprises a transistor MP1, a transistor MN1 and a transistor MP2 coupled to the first connection 131. Transistor MP1 comprises a gate terminal 141 coupled to the first connection 131 to receive PGATE, a first terminal 142 coupled to VDDIO, and a second terminal 143. Transistor MN1 comprises a gate terminal 144 coupled to the first connection 131 to receive PGATE, a first terminal 145 coupled to the second terminal 143 of transistor MP1, and a second terminal 146 coupled to VSS. Transistor MP2 comprises a gate terminal 147 coupled via a connection net1 to the second terminal 143 of transistor MP1 and the first terminal 145 of transistor MN1, a first terminal 148 coupled to the first connection 131, and a second terminal 149 coupled to the terminal 118 of transistor MN10. The second terminal 149 of transistor MP2 is coupled to VSS via transistor MN10. In at least one embodiment, the second terminal 149 of transistor MP2 is coupled to VSS via another transistor (not shown), or is directly coupled to VSS as described, for example, with respect to FIG. 2.

The compensation circuit 140 further comprises a transistor MN2, a transistor MP3 and a transistor MN3 coupled to the second connection 132. Transistor MN2 comprises a gate terminal 151 coupled to the second connection 132 to receive NGATE, a first terminal 152 coupled to VSS, and a second terminal 153. Transistor MP3 comprises a gate terminal 154 coupled to the second connection 132 to receive NGATE, a first terminal 155 coupled to the second terminal 153 of transistor MN2, and a second terminal 156 coupled to VDDIO. Transistor MN3 comprises a gate terminal 157 coupled via a connection net2 to the second terminal 153 of transistor MN2 and the first terminal 155 of transistor MP3, a first terminal 158 coupled to the second connection 132, and a second terminal 159 coupled to the terminal 128 of transistor MP11. In other words, the second terminal 159 of transistor MN3 is coupled to VDDIO via transistor MP11; however, this is an example. In at least one embodiment, the second terminal 159 of transistor MN3 is coupled to VDDIO via another transistor (not shown), or is directly coupled to VDDIO as described, for example, with respect to FIG. 2.

Figure 1B:
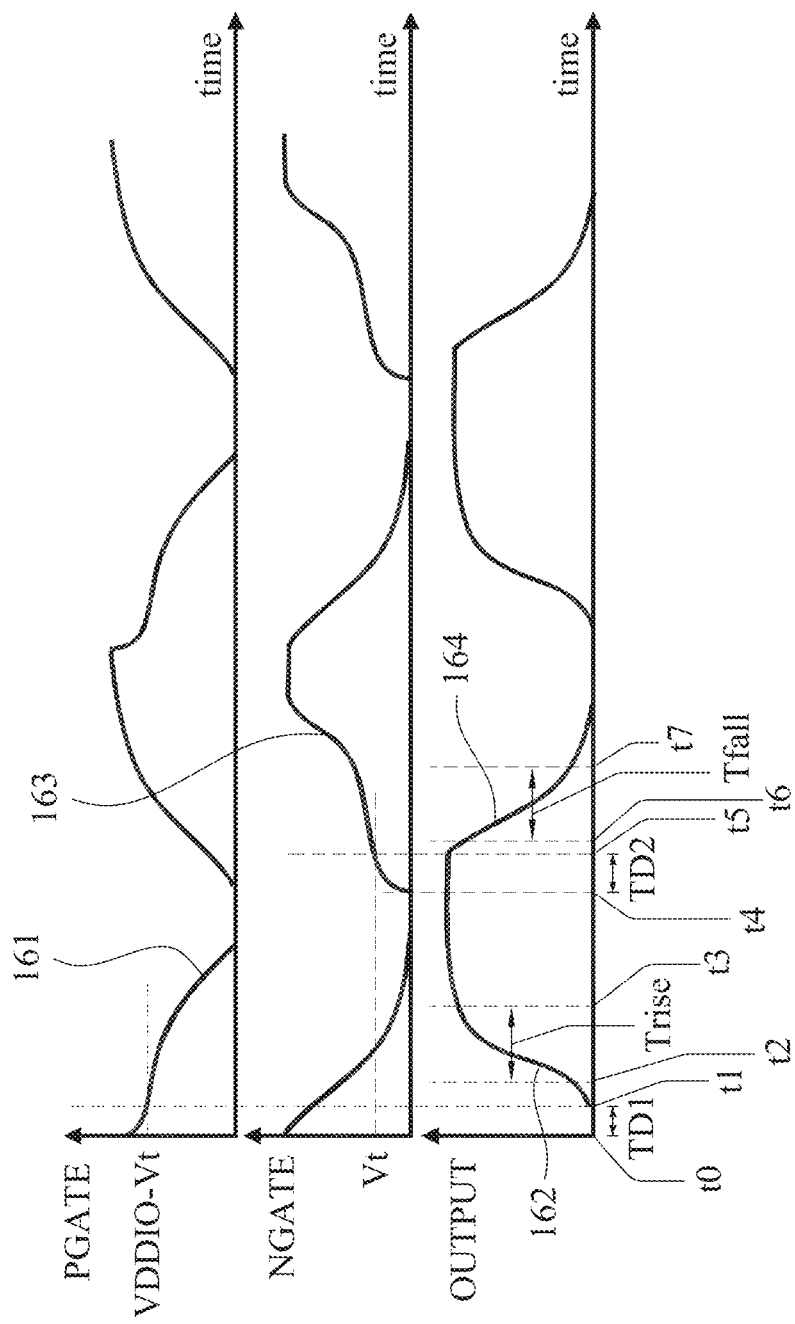
FIG. 1B includes time graphs of various signals in the circuit of FIG. 1A, in accordance with some embodiments.

FIG. 1B includes time graphs of various signals in the circuit 100 of FIG. 1A, in accordance with some embodiments. Specifically, time graphs of voltages of PGATE on the first connection 131, NGATE on the second connection 132, and signal OUTPUT at the output node 136 are given in FIG. 1B.

At timing t0, the voltage of PGATE is at a high voltage level, such as, VDDIO. The timing t0 is a beginning of a first edge 161 of PGATE. The first edge 161 is a falling edge along which the voltage of PGATE falls from VDDIO to VSS. This falling edge is generated, for example as described with respect to FIG. 1A, when pre-PGATE is at VDDIO, causing transistor MP10 to be turned OFF, transistor MN10 to be turned ON, and the voltage of PGATE on the first connection 131 to fall toward VSS via the turned ON transistor MN10. The falling rate, or speed, at which the voltage of PGATE falls along the first edge 161 from VDDIO to VSS is controlled by the first slew rate control circuit 111, either actively in response to a slew rate control signal as described with respect to FIG. 2, or passively by a circuit configuration of the first slew rate control circuit 111 as described with respect to FIG. 3, or both. The compensation circuit 140 is provided to increase the falling rate of PGATE in an initial stage of the first edge 161.

Specifically, in the compensation circuit 140, the high voltage level at the beginning of the first edge 161 of PGATE is applied via the first connection 131 to the gate terminals 141, 144 of transistor MP1 and transistor MN1, respectively, causing transistor MP1 to be turned OFF and transistor MN1 to be turned ON. VSS is applied via the turned ON transistor MN1 and the connection net1 to the gate terminal 147 of transistor MP2, causing transistor MP2 to be turned ON. As a result, VSS is applied via the turned ON transistor MN1 and the turned ON transistor MP2 to the first connection 131, causing the voltage of PGATE to fall at an increased falling rate toward VSS.

At timing t1, the voltage of PGATE falling toward VSS reaches a threshold voltage VDDIO-Vt (hereinafter "VDDIO-Vt") at which the PMOS transistors in at least the output circuit 130 and the compensation circuit 140 are turned ON. In the compensation circuit 140, transistor MP1 is turned ON and transistor MN1 is turned OFF when the voltage of PGATE reaches and falls further below VDDIO-Vt. VDDIO is applied via the turned ON transistor MP1 and the connection net1 to the gate terminal 147 of transistor MP2, causing transistor MP2 to be turned OFF. As a result, VSS is disconnected by at least the turned OFF transistor MP2 from the first connection 131. For a remainder of the first edge 161 after timing t1, the compensation circuit 140 no longer affects PGATE. As illustrated in the example time graphs in FIG. 1B, the falling rate of the voltage of PGATE during the initial stage of the first edge 161, between timing t0 and timing t1 when the compensation circuit 140 is enabled for operation based on PGATE, is greater than during a remainder of the first edge 161, after timing t1 when the compensation circuit 140 is disabled for operation based on PGATE.

In the output circuit 130, transistor MP12 is turned ON when the voltage of PGATE reaches and falls further below VDDIO-Vt. VDDIO is applied via the turned ON transistor MP12 to the output node 136, causing a second edge 162, which is a rising edge, of signal OUTPUT to begin rising at timing t1. The second edge 162 of signal OUTPUT is generated by the output circuit 130 in response to the first edge 161 of PGATE supplied from the driver circuit 110. The second edge 162 of signal OUTPUT follows the corresponding first edge 161 of PGATE with a propagation delay TD1 between the beginning of the first edge 161 of PGATE at timing t0 and the beginning of the second edge 162 of signal OUTPUT at timing t1.

A slew rate of the second edge 162 is determined as $\Delta V/\Delta t$, where $\Delta t$ is the time it takes signal OUTPUT to rise $\Delta V$ from one predetermined percentage of a maximum voltage level to another predetermined percentage of the maximum voltage level. In an example, the predetermined percentages for determining a slew rate are 10% and 90%, i.e., $\Delta V$ is 80% of the maximum voltage level. In another example, the predetermined percentages for determining a slew rate are 20% and 80%, i.e., $\Delta V$ is 60% of the maximum voltage level. Other predetermined percentages for determining a slew rate are within the scopes of various embodiments. In examples described herein, the predetermined percentages for determining a slew rate are 10% and 90%, and $\Delta V$ is 80% of the maximum voltage level.

In the example configuration in FIG. 1B, the slew rate of the second edge 162 is determined as $\Delta V/T_{rise}$, where Trise is a time from timing t2, where the voltage of signal OUTPUT on the second edge 162 reaches 10% of VDDIO, to timing t3, where the voltage of signal OUTPUT on the second edge 162 reaches 90% of VDDIO. The longer the Trise, the smaller the slew rate. The slew rate of the second edge 162 corresponds to the falling rate of the voltage of PGATE on the first edge 161, as controlled by the first slew rate control circuit 111. For example, when the voltage of PGATE falls slowly along the first edge 161 from VDDIO-Vt at timing t1 to VSS, the voltage of signal OUTPUT also rises slowly along the second edge 162 or, in other words, the second edge 162 has a smaller slew rate. When the voltage of PGATE falls quickly along the first edge 161 from VDDIO-Vt to VSS, the voltage of signal OUTPUT also rises quickly along the second edge 162 or, in other words, the second edge 162 has a greater slew rate.

As described herein, the compensation circuit 140 is enabled at a beginning of the first edge 161 to pull the voltage of PGATE toward the threshold voltage VDDIO-Vt. The compensation circuit 140 is enabled when the compensation circuit 140 affects a changing rate of the voltage of PGATE on the first edge 161. For example, the compensation circuit 140 is enabled by the turning ON of transistor MP2 during the initial stage between timing t0 and timing t1 when the falling rate of the voltage of PGATE along the first edge 161 toward VDDIO-Vt is increased by the enabled compensation circuit 140. As a result, compared to other approaches without a compensation circuit, the voltage of PGATE reaches VDDIO-Vt faster, resulting in an earlier beginning or start of the second edge 162 of signal OUTPUT at timing t1, and the shorter propagation delay TD1, in at least one embodiment. The shorter propagation delay TD1 ensures speed performance of the circuit 100 as designed, in at least one embodiment. In contrast, other approaches without a compensation circuit potentially suffer from a lower operation speed because, due to an excessive propagation delay, it is potentially impossible for the output signal to achieve a full swing within the limited time available.

Further, in response to and after the voltage of PGATE on the first edge 161 reaching the threshold voltage VDDIO-Vt, the compensation circuit 140 is disabled. The compensation circuit 140 is disabled when the compensation circuit 140 no longer affects the changing rate of the voltage of PGATE on the first edge 161. For example, the compensation circuit 140 is disabled by the turning OFF of transistor MP2 during a remainder of the first edge 161 after timing t1. As a result, the slew rate of the second edge 162 of signal OUTPUT is controlled by the first slew rate control circuit 111 as designed, without being affected by the compensation circuit 140, in at least one embodiment.

The operation of the circuit 100 based on NGATE is similar to the described operation based on PGATE. Specifically, at timing t4, the voltage of NGATE is at a low voltage level, such as, VSS. The timing t4 is a beginning of a third edge 163 of NGATE. The third edge 163 is a rising edge along which the voltage of NGATE rises from VSS to VDDIO. This rising edge is generated, for example as described with respect to FIG. 1A, when pre-NGATE is at VSS, causing transistor MN11 to be turned OFF, transistor MP11 to be turned ON, and the voltage of NGATE on the second connection 132 to rise toward VDDIO via the turned ON transistor MP11. The rising rate, or speed, at which the voltage of NGATE rises along the third edge 163 from VSS to VDDIO is controlled by the second slew rate control circuit 112, either actively in response to a slew rate control signal as described with respect to FIG. 2, or passively by a circuit configuration of the second slew rate control circuit 112 as described with respect to FIG. 3, or both. The compensation circuit 140 is provided to increase the rising rate of NGATE in an initial stage of the third edge 163.

Specifically, in the compensation circuit 140, the low voltage level at the beginning of the third edge 163 of NGATE is applied via the second connection 132 to the gate terminals 151, 154 of transistor MN2 and transistor MP3, respectively, causing transistor MN2 to be turned OFF and transistor MP3 to be turned ON. VDDIO is applied via the turned ON transistor MP3 and the connection net2 to the gate terminal 157 of transistor MN3, causing transistor MN3 to be turned ON. As a result, VDDIO is applied via the turned ON transistor MP3 and the turned ON transistor MN3 to the second connection 132, causing the voltage of NGATE to rise at an increased rising rate toward VDDIO.

At timing t5, the voltage of NGATE rising toward VDDIO reaches a threshold voltage Vt (hereinafter "Vt") at which the NMOS transistors in at least the output circuit 130 and the compensation circuit 140 are turned ON. In the compensation circuit 140, transistor MN2 is turned ON and transistor MP3 is turned OFF when the voltage of NGATE reaches and rises further above Vt. VSS is applied via the turned ON transistor MN2 and the connection net2 to the gate terminal 157 of transistor MN3, causing transistor MN3 to be turned OFF. As a result, VDDIO is disconnected by at least the turned OFF transistor MN3 from the second connection 132. For a remainder of the third edge 163 after timing t5, the compensation circuit 140 no longer affects NGATE. As illustrated in the example time graphs in FIG. 1B, the rising rate of the voltage of NGATE during the initial stage of the third edge 163, between timing t4 and timing t5 when the compensation circuit 140 is enabled for operation based on NGATE, is greater than during a remainder of the third edge 163, after timing t5 when the compensation circuit 140 is disabled for operation based on NGATE.

In the output circuit 130, transistor MN12 is turned ON when the voltage of NGATE reaches and rises further above Vt. VSS is applied via the turned ON transistor MN12 to the output node 136, causing a fourth edge 164, which is a falling edge, of signal OUTPUT to begin falling at timing t5. The fourth edge 164 of signal OUTPUT is generated by the output circuit 130 in response to the third edge 163 of NGATE supplied from the driver circuit 110. The fourth edge 164 of signal OUTPUT follows the corresponding third edge 163 of NGATE with a propagation delay TD2 between the beginning of the third edge 163 of NGATE at timing t4 and the beginning of the fourth edge 164 of signal OUTPUT at timing t5.

In the example configuration in FIG. 1B, the slew rate of the fourth edge 164 is determined as $\Delta V/Tfall$, where Tfall is a time from timing t6, where the voltage of signal OUTPUT on the fourth edge 164 reaches 90% of VDDIO, to timing t7, where the voltage of signal OUTPUT on the fourth edge 164 reaches 10% of VDDIO. The longer the Tfall, the smaller the slew rate. The slew rate of the fourth edge 164 corresponds to the rising rate of the voltage of NGATE on the third edge 163, as controlled by the second slew rate control circuit 112. For example, when the voltage of NGATE rises slowly along the third edge 163 from Vt at timing t5 to VDDIO, the voltage of signal OUTPUT also falls slowly along the fourth edge 164 or, in other words, the fourth edge 164 has a smaller slew rate. When the voltage of NGATE rises quickly along the third edge 163 from Vt to VDDIO, the voltage of signal OUTPUT also falls quickly along the fourth edge 164 or, in other words, the fourth edge 164 has a greater slew rate.

In at least one embodiment, one or more advantages described with respect to the operation based on PGATE, such as reduced propagation delay, ensured speed performance and/or slew rate control as designed, are also achievable with respect to the operation based on NGATE.

In the example configuration in FIGS. 1A-1B, the specifically described circuits and/or the specifically described switching ON or OFF of various transistors are examples. Other configurations are within the scopes of various embodiments. In an example, other circuit configurations of the compensation circuit 140 are possible in one or more embodiments, provided that the compensation circuit 140 is enabled in the initial stage of an edge of PGATE or NGATE, and then automatically disabled when and after PGATE or NGATE reaches a corresponding threshold voltage. In another example, although it is described with respect to FIGS. 1A-1B that an edge of signal OUTPUT begins to rise or fall when a transistor, i.e., transistor MP12 or transistor MN12, of the output circuit 130 is turned ON, it is possible in at least one embodiment to configure the circuit 100 so that an edge of signal OUTPUT begins to rise or fall when a transistor in the output circuit 130 is turned OFF.

In some embodiments, the PMOS transistors in the circuit 100 all have the same threshold voltage VDDIO-Vt and/or the NMOS transistors in the circuit 100 all have the same threshold voltage Vt. For example, all transistors in the circuit 100 are I/O (input/output) devices, or all transistors in the circuit 100 are core devices. Core devices are low voltage devices with thinner gate oxide layers, and are configured to be sufficiently large to handle low voltage swing signals, but are usually not large enough to handle large voltage swing signals. On the other hand, I/O devices are high voltage devices with thicker gate oxide layers, and are configured to handle large voltage swing signals and usually occupy a larger die space than core devices.

In some embodiments, PMOS transistors with different threshold voltages and/or NMOS transistors with different threshold voltages are included in the circuit 100. For example, transistor MP1 and transistor MP2 in the compensation circuit 140 are switched at a threshold voltage other than the threshold voltage at which transistor MP12 in the output circuit 130 is switched. In at least one embodiment, transistor MP1 is turned ON and transistor MP2 is turned OFF, i.e., the compensation circuit 140 is disabled in the operation based on PGATE, before transistor MP12 is turned ON, i.e., before signal OUTPUT corresponding to PGATE begins to rise.

In the example configuration in FIG. 1A, the same positive power supply voltage VDDIO is supplied to various transistors and/or circuits in the circuit 100. In some embodiments, different positive power supply voltages are supplied to various transistors and/or circuits in the circuit 100. For example, as described with respect to FIG. 4A, VDDIO is supplied to a driver circuit and a compensation circuit, whereas a different power supply voltage VBUS (hereinafter "VBUS") is supplied to an output circuit. In at least one embodiment, VBUS is higher than VDDIO.

Some embodiments, for example, as described with respect to FIG. 1A, are configured to operate in a dual signal scheme with a pair of signals, such as PGATE/NGATE and/or pre-PGATE/pre-NGATE. At least one embodiment is configured to operate in a single-ended signal scheme, for example, as described with respect to FIG. 4A.

Some embodiments are applicable to various applications where slew rate control is used, such as amplifiers, audio electronics, standard opamp (operational amplifier) circuits, or the like.

Figure 2:
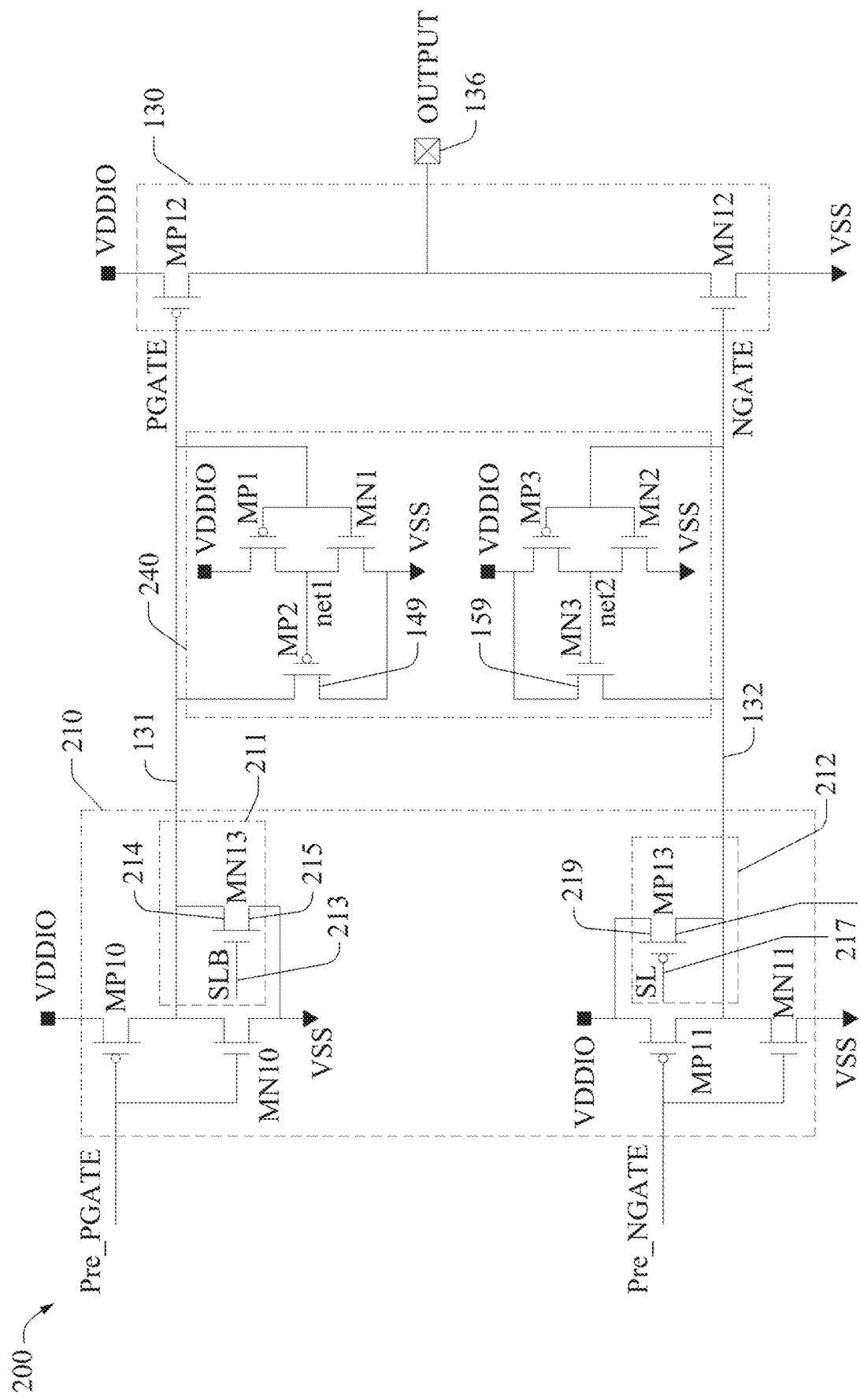
FIG. 2 is a schematic circuit diagram of a circuit for slew rate control, in accordance with some embodiments.

FIG. 2 is a schematic circuit diagram of a circuit 200 for slew rate control, in accordance with some embodiments. The circuit 200 comprises a driver circuit 210, the output circuit 130, and a compensation circuit 240.

Compared to the driver circuit 110, the driver circuit 210 includes first and second slew rate control circuits 211, 212 which are example circuits for the first and second slew rate control circuits 111, 112, respectively. The first slew rate control circuit 211 comprises transistor MN13 having a gate terminal 213 coupled to receive a first slew rate control signal SLB (hereinafter "SLB"), a first terminal 214 coupled to the first connection 131, and a second terminal 215 coupled to VSS. The second slew rate control circuit 212 comprises transistor MP13 having a gate terminal 217 coupled to receive a second slew rate control signal SL (hereinafter "SL"), a first terminal 218 coupled to the second connection 132, and a second terminal 219 coupled to VDDIO.

Compared to the compensation circuit 140, the compensation circuit 240 differs in that the second terminal 149 of transistor MP2 is directly coupled to VSS, and the second terminal 159 of transistor MN3 is directly coupled to VDDIO.

Except for the specific slew rate control achieved through the first and second slew rate control circuits 211, 212, the operation of the circuit 200 is similar to that of the circuit 100. The first and second slew rate control circuits 211, 212 are configured to actively perform (or not perform) slew rate control, in accordance with SLB and SL, respectively. In at least one embodiment, SLB is an inverted signal of SL. In at least one embodiment, SLB and SL are input into the first and second slew rate control circuits 211, 212, respectively, from a circuit external to the circuit 200 for switching the circuit 200 between a slew-rate-control mode and a non-slew-rate-control mode.

In the slew-rate-control mode, SL is at a logic high level, SLB is at a low logic level, and transistor MP13 and transistor MN13 are turned OFF. The voltage of PGATE falls slowly from VDDIO-Vt toward VSS via the turned ON transistor MN10, causing signal OUTPUT to rise slowly with a smaller slew rate. Similarly, the voltage of NGATE rises slowly from Vt toward VDDIO via the turned ON transistor MP11, causing signal OUTPUT to fall slowly with a smaller slew rate. As a result, slew rate control is performed.

In the non-slew-rate-control mode, SL is at a logic low level, SLB is at a high logic level, and transistor MP13 and transistor MN13 are turned ON. The voltage of PGATE falls quickly from VDDIO-Vt toward VSS via both the turned ON transistor MN10 and the turned ON transistor MN13, causing signal OUTPUT to rise quickly with a greater slew rate. Similarly, the voltage of NGATE rises quickly from Vt toward VDDIO via both the turned ON transistor MP11 and the turned ON transistor MP13, causing signal OUTPUT to fall quickly with a greater slew rate. As a result, slew rate control is not performed.

In at least one embodiment, one or more advantages and/or applications and/or modifications described with respect to the circuit 100 are also achievable in the circuit 200.

Figure 3:
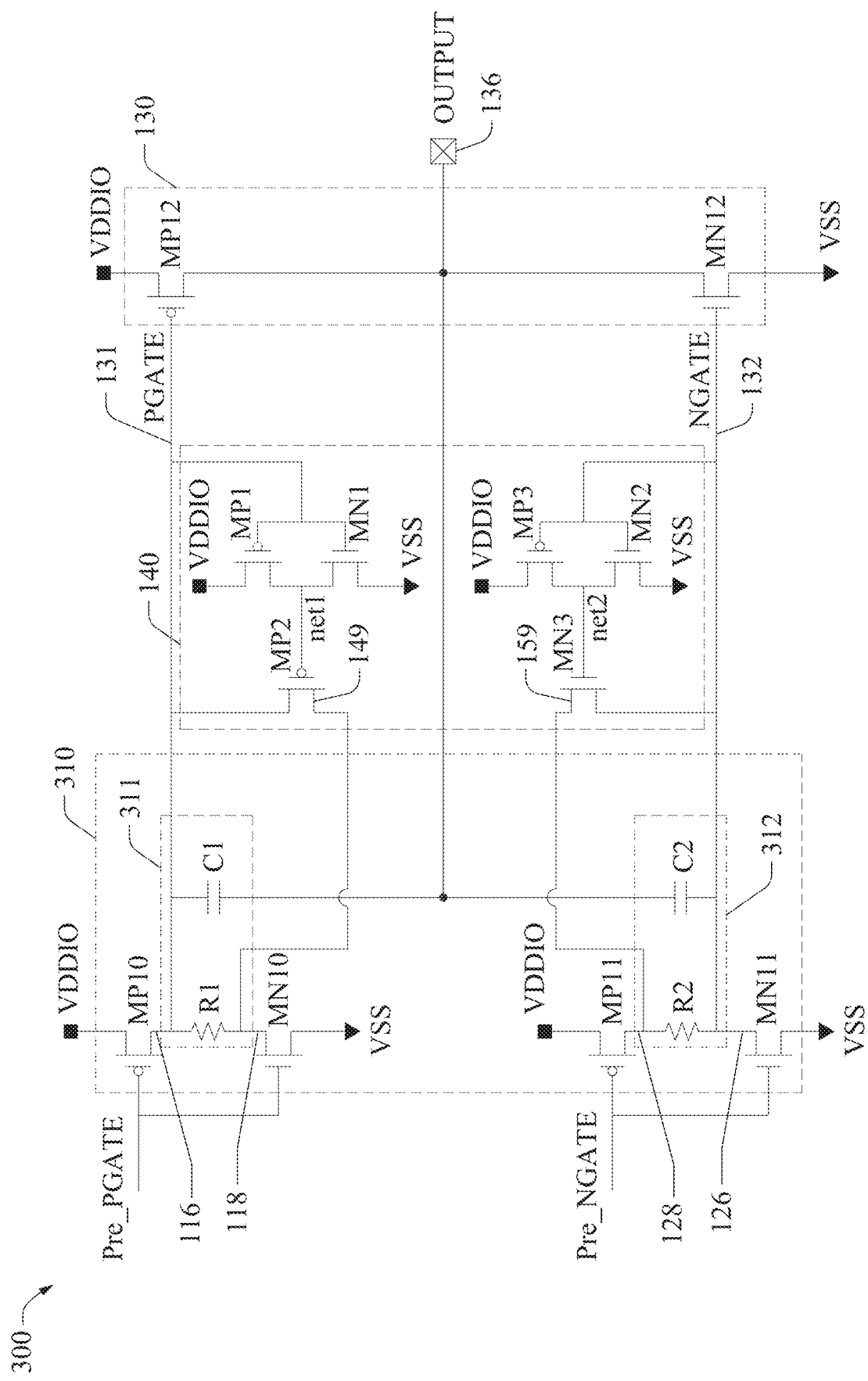
FIG. 3 is a schematic circuit diagram of a circuit for slew rate control, in accordance with some embodiments.

FIG. 3 is a schematic circuit diagram of a circuit 300 for slew rate control, in accordance with some embodiments. The circuit 300 comprises a driver circuit 310, the output circuit 130, and the compensation circuit 140.

Compared to the driver circuit 110, the driver circuit 310 includes first and second slew rate control circuits 311, 312 which are example circuits for the first and second slew rate control circuits 111, 112, respectively. The first slew rate control circuit 311 comprises a capacitor C1 and a resistor R1. Capacitor C1 is coupled between the first connection 131 and the output node 136. Resistor R1 has one end coupled to the first terminal 118 of transistor MN10 and the second terminal 149 of transistor MP2, and another end coupled to the first connection 131 and the second terminal 116 of transistor MP10. The second slew rate control circuit 312 comprises a capacitor C2 and a resistor R2. Capacitor C2 is coupled between the second connection 132 and the output node 136. Resistor R2 has one end coupled to the first terminal 128 of transistor MP11 and the second terminal 159 of transistor MN3, and another end coupled to the second connection 132 and the second terminal 126 of transistor MN11

Except for the specific slew rate control achieved through the first and second slew rate control circuits 311, 312, the operation of the circuit 300 is similar to that of the circuit 100. The first and second slew rate control circuits 311, 312 are configured to passively perform slew rate control by respective circuit configurations thereof.

On a falling edge of PGATE from VDDIO to VSS, capacitor C1, which was charged in a previous rising edge of PGATE, is discharged through resistor R1 and the turned ON transistor MN10 to VSS. Due to the discharging of capacitor C1 through resistor R1, the voltage of PGATE falls slowly on the falling edge, resulting in a corresponding slowly rising edge with a decreased slew rate of signal OUTPUT. Similarly, on a falling edge of NGATE from VDDIO to VSS, capacitor C2, which was charged in a previous rising edge of NGATE, is discharged through the turned ON transistor MN11 to VSS. The discharging of capacitor C2 is not as slow as the discharging of capacitor C1, because resistor R2 is not involved in the discharging of capacitor C2. As a result, the voltage of NGATE falls to VSS faster than the voltage of PGATE, but still slower than when a slew rate control circuit is not included.

On a rising edge of NGATE from VSS to VDDIO, capacitor C2 is charged from VDDIO through the turned ON transistor MP11 and resistor R2. Due to the charging of capacitor C2 through resistor R2, the voltage of NGATE rises slowly on the rising edge, resulting in a corresponding slowly falling edge with a decreased slew rate of signal OUTPUT. Similarly, on a rising edge of PGATE from VSS to VDDIO, capacitor C1 is charged from VDDIO through the turned ON transistor MP10. The charging of capacitor C1 is not as slow as the charging of capacitor C2, because resistor R1 is not involved in the charging of capacitor C1. As a result, the voltage of PGATE rises to VDDIO faster than the voltage of NGATE, but still slower than when a slew rate control circuit is not included.

In at least one embodiment, one or more advantages and/or applications and/or modifications described with respect to the circuit 100 are also achievable in the circuit 300.

Figure 4A:
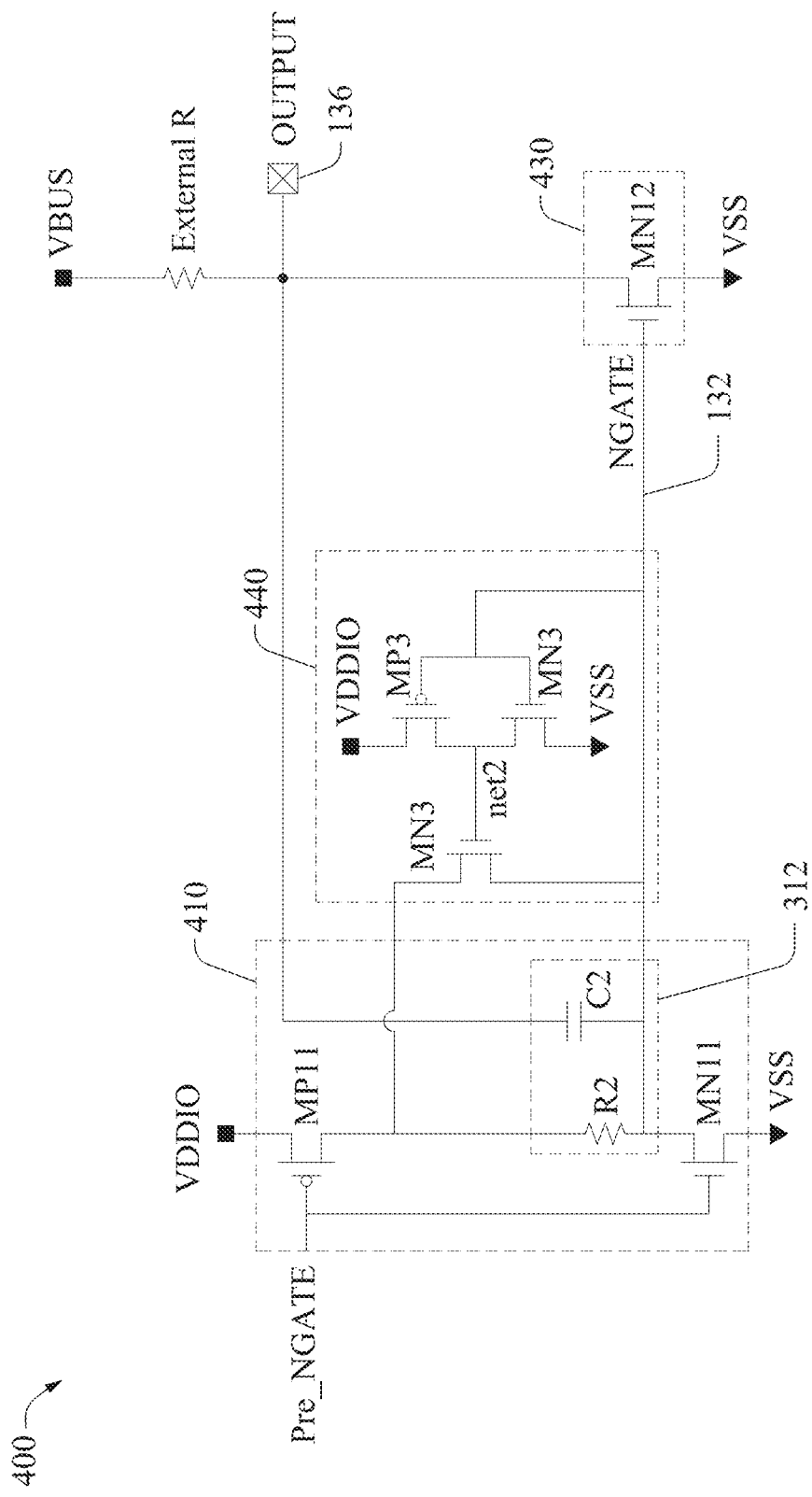
FIG. 4A is a schematic circuit diagram of a circuit for slew rate control, in accordance with some embodiments.

FIG. 4A is a schematic circuit diagram of a circuit 400 for slew rate control, in accordance with some embodiments. The circuit 400 comprises a driver circuit 410, an output circuit 430, and a compensation circuit 440. Compared to the circuit 300 which is configured to operate in a dual signal scheme, the circuit 400 is configured to operate in a single-ended signal scheme and includes a half of the circuit 300. Specifically, the driver circuit 410 includes a half of the driver circuit 310 that is associated with NGATE. The output circuit 430 includes a half of the output circuit 130 that is associated with NGATE. The compensation circuit 440 includes a half of the compensation circuit 140 that is associated with NGATE. In the circuit 400, the output node 136 is coupled to a power supply voltage VBUS via an external resistor ExternalR. In at least one embodiment, the circuit 400 is an I/O circuit coupled via the output node 136 to external circuitry which is powered by the power supply voltage VBUS. Resistor ExternalR represents a load of the circuit 400 and corresponds to an equivalent resistor of the external circuitry.

Figure 4B:
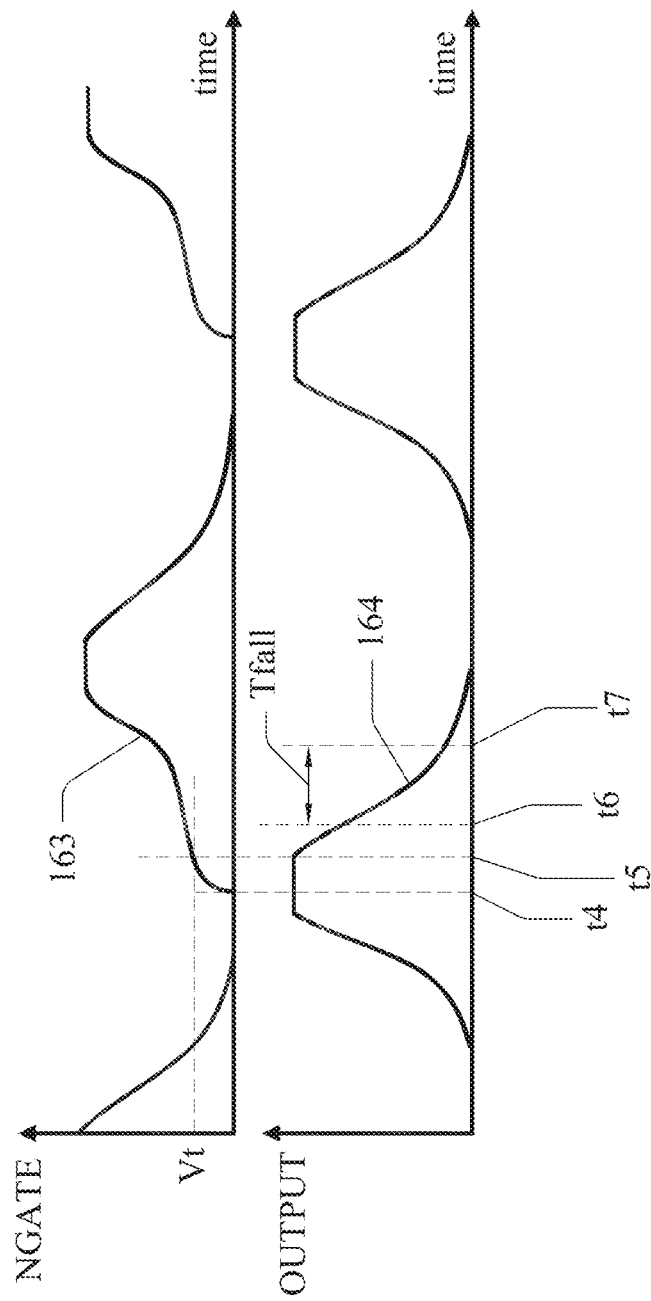
FIG. 4B includes time graphs of various signals in the circuit of FIG. 4A, in accordance with some embodiments.

FIG. 4B includes time graphs of various signals in the circuit 400 of FIG. 4A, in accordance with some embodiments. Compared to the circuit 100, the circuit 200 and the circuit 300 where slew rate control and operation of the corresponding compensation circuit 140 or 240 are achievable for both rising edge and falling edge of signal OUTPUT, in the circuit 400, slew rate control and operation of the compensation circuit 440 are achievable for one edge of signal OUTPUT.

Specifically, as illustrated in the example time graphs in FIG. 4B and similarly to the operation based on NGATE described with respect to FIG. 1B, the compensation circuit 440 is enabled at timing t4 corresponding to a beginning of a rising edge 163 of NGATE, to pull the voltage of NGATE toward the threshold voltage Vt, and to speed up turning ON of transistor MN12 of the output circuit 430 and the associated beginning of a corresponding falling edge 164 of signal OUTPUT. In response to the voltage of NGATE on the rising edge 163 reaching the threshold voltage Vt, the compensation circuit 340 is disabled and the voltage of signal OUTPUT begins to rise at timing t5. Thereafter, the slew rate (inversely proportional to Tfall in FIG. 4B) of the falling edge 164 of signal OUTPUT is controlled by the slew rate control circuit 312 as described with respect to FIG. 3, without being affected by the compensation circuit 440 which has been disabled.

In at least one embodiment, one or more advantages and/or applications and/or modifications described with respect to the circuit 100 are also achievable in the circuit 400.

Figure 5:
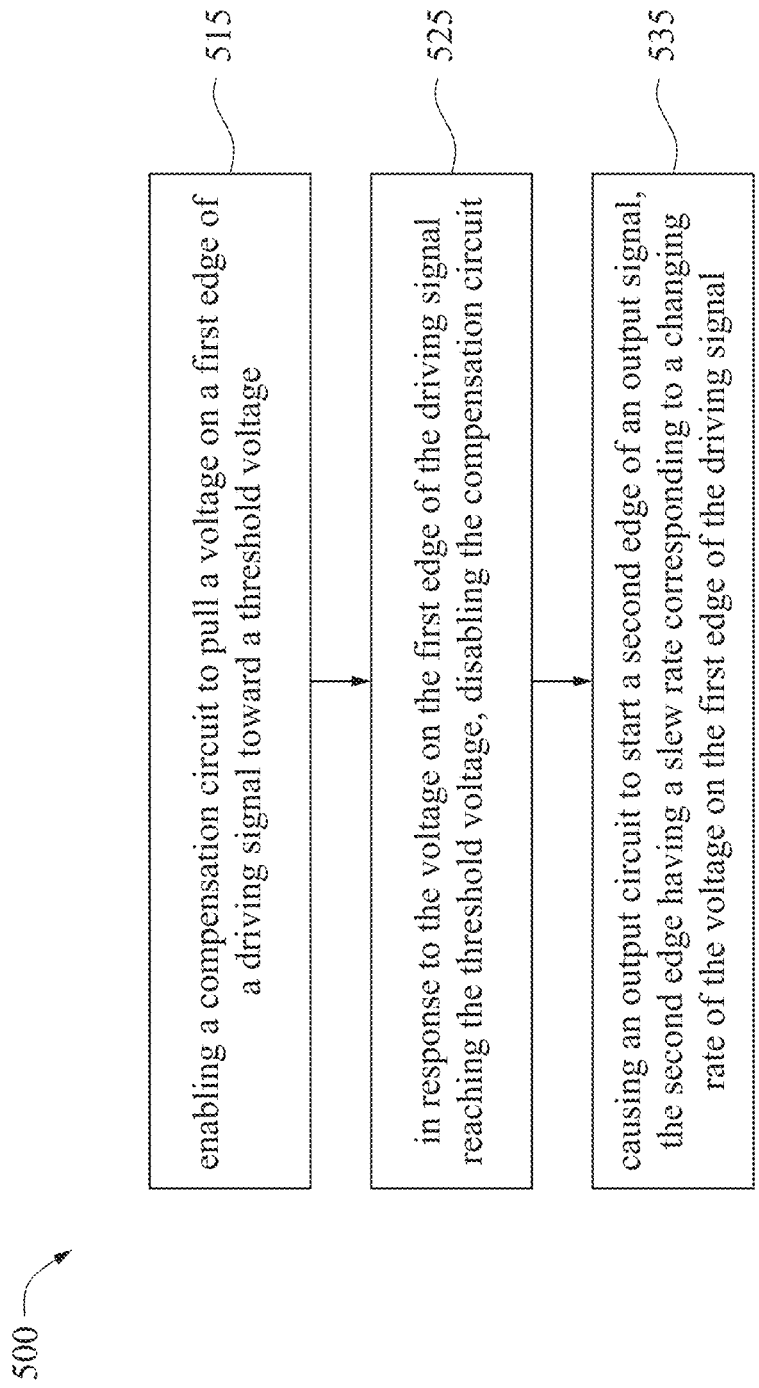
FIG. 5 is a flowchart of a method of operating a circuit for slew rate control in accordance with some embodiments.

FIG. 5 is a flowchart of a method 500 of operating a circuit for slew rate control in accordance with some embodiments. In at least one embodiment, the method 500 is performed by one or more of the circuit 100, circuit 200, circuit 300 and circuit 400 described herein.

At operation 515, a compensation circuit is enabled at a beginning of a first edge of a driving signal to pull a voltage on the first edge of the driving signal toward a threshold voltage. For example, the compensation circuit 140 is enabled at timing t0, i.e., a beginning of a first edge 161 of a driving signal PGATE to pull a voltage on the first edge 161 of the driving signal PGATE toward a threshold voltage VDDIO-Vt, as described with respect to FIGS. 1A-1B. For another example, the compensation circuit 440 is enabled at timing t0, i.e., a beginning of an edge 163 of a driving signal NGATE, to pull a voltage on the edge 163 of the driving signal NGATE toward a threshold voltage Vt, as described with respect to FIGS. 4A-4B.

At operation 525, the compensation circuit is disabled in response to the voltage on the first edge of the driving signal reaching the threshold voltage. For example, the compensation circuit 140 is disabled at timing t1 when the voltage on the first edge 161 of the driving signal PGATE reaches VDDIO-Vt, as described with respect to FIGS. 1A-1B. For another example, the compensation circuit 440 is disabled at timing t5 when the voltage on the edge 163 of the driving signal NGATE reaches Vt, as described with respect to FIGS. 4A-4B.

At operation 535, an output circuit starts a second edge of an output signal, and the second edge has a slew rate corresponding to a changing rate of the voltage on the first edge of the driving signal. For example, the output circuit 130 starts a second edge 162 of signal OUTPUT when the compensation circuit 140 is disabled, as described with respect to FIGS. 1A-1B. Further, the second edge 162 has a slew rate (for example, inversely proportional to Trise in FIG. 1B) that corresponds to a changing rate of the voltage on the first edge 161 of the driving signal PGATE, as described with respect to FIGS. 1A-1B, 2 and 3. For another example, the output circuit 430 starts an edge 164 of signal OUTPUT when the compensation circuit 440 is disabled, as described with respect to FIGS. 4A-4B. Further, the edge 164 has a slew rate (for example, inversely proportional to Tfall in FIG. 1B or FIG. 4B) that corresponds to a changing rate of the voltage on the edge 163 of the driving signal NGATE, as described with respect to FIGS. 3 and 4A-4B.

The described methods and algorithms include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In a method of operating a circuit in accordance with some embodiments, at a beginning of a first edge of a driving signal, a first transistor in a compensation circuit is turned ON to pull, at a first changing rate, a voltage of the driving signal on the first edge from a first voltage toward a second voltage different from the first voltage. Then, in response to the voltage of the driving signal on the first edge reaching a threshold voltage between the first voltage and the second voltage, the first transistor is turned OFF and an output circuit is caused to start a second edge of an output signal in response to the first edge of the driving signal. The second edge has a slew rate corresponding to a second changing rate of the voltage of the driving signal on the first edge from the threshold voltage toward the second voltage. The second changing rate is smaller than the first changing rate.

In some embodiments, a circuit comprises a driver circuit configured to generate a driving signal having a first edge, an output circuit coupled to the driver circuit via a connection to receive the driving signal on the connection and configured to generate an output signal in response to the driving signal, and a compensation circuit coupled to the connection. The compensation circuit comprises a first transistor of a first type. The output circuit comprises a second transistor of the first type. At a beginning of the first edge of the driving signal, the first transistor is configured to be turned ON to pull a voltage of the driving signal on the first edge from a first voltage toward a second voltage, and the second transistor is configured to be turned OFF. In response to the voltage of the driving signal on the first edge reaching a threshold voltage between the first voltage and the second voltage, the first transistor is configured to be turned OFF, and the second transistor is configured to be turned ON to start a second edge of the output signal.

In some embodiments, a circuit comprises a first connection configured to carry a first driving signal, and first and second transistors of a first type. The first transistor comprises: a gate terminal coupled to receive a signal corresponding to the first driving signal, a first terminal coupled to the first connection, and a second terminal coupled to a second power supply voltage. The second transistor comprises: a gate terminal coupled to the first connection to receive the first driving signal, a first terminal coupled to a first power supply voltage, and a second terminal coupled to an output node where an output signal is to be output.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a circuit, the method comprising:
    at a beginning of a first edge of a driving signal, turning ON a first transistor in a compensation circuit to pull, at a first changing rate, a voltage of the driving signal on the first edge from a first voltage toward a second voltage different from the first voltage; and then
    in response to the voltage of the driving signal on the first edge reaching a threshold voltage between the first voltage and the second voltage,
        turning OFF the first transistor, and
        causing an output circuit to start a second edge of an output signal in response to the first edge of the driving signal, the second edge having a slew rate corresponding to a second changing rate of the voltage of the driving signal on the first edge from the threshold voltage toward the second voltage, the second changing rate smaller than the first changing rate,
    the method further comprising:
    controlling, by a control signal, the second changing rate of the voltage of the driving signal on the first edge from the threshold voltage toward the second voltage.

2. The method of claim 1, wherein:
the first edge of the driving signal is a falling edge,
the turned ON first transistor in the compensation circuit pulls down the voltage of the driving signal on the first edge toward the threshold voltage, and
the second edge of the output signal is a rising edge which starts to rise in response to the voltage of the driving signal on the first edge reaching the threshold voltage and turning OFF the first transistor in the compensation circuit.

3. The method of claim 1, wherein:
the first edge of the driving signal is a rising edge,
the turned ON first transistor in the compensation circuit pulls up the voltage of the driving signal on the first edge toward the threshold voltage, and
the second edge of the output signal is a falling edge which starts to fall in response to the voltage of the driving signal on the first edge reaching the threshold voltage and turning OFF the first transistor in the compensation circuit.

4. The method of claim 1, further comprising:
applying the driving signal to a gate of a second transistor in the output circuit; and
after said turning OFF the first transistor, turning ON the second transistor to start the second edge of the output signal.

5. The method of claim 1, further comprising:
applying the driving signal to a gate of a second transistor in the output circuit to turn ON the second transistor to start the second edge of the output signal in response to the voltage of the driving signal on the first edge reaching the threshold voltage.

6. The method of claim 1, further comprising:
applying a first power supply voltage to a first terminal of the first transistor,
wherein, in response to said turning ON the first transistor, the first power supply voltage pulls the voltage of the driving signal on the first edge from the first voltage toward the threshold voltage and the second voltage.

7. The method of claim 6, wherein:
the first voltage is a second power supply voltage different from the first power supply voltage, and
the second voltage is the first power supply voltage.

8. The method of claim 1, wherein:
said controlling comprises:
    in response to the control signal having a first logic level, causing the second changing rate to have a first value, and
    in response to the control signal having a second logic level different from the first logic level, causing the second changing rate to have a second value different from the first value.

9. The method of claim 1, wherein:
said causing the second changing rate to have the first value comprises turning ON a transistor in a slew rate control circuit, and
said causing the second changing rate to have the second value comprises turning OFF the transistor in the slew rate control circuit.

10. The method of claim 1, wherein:
the control signal is independent from the driving signal.

11. A circuit, comprising:
a driver circuit configured to generate a driving signal having a first edge;
an output circuit coupled to the driver circuit via a connection to receive the driving signal on the connection, the output circuit configured to generate, at an output node, an output signal in response to the driving signal;
a capacitor coupled between the connection and the output node; and
a compensation circuit coupled to the connection,
wherein
the compensation circuit comprises a first transistor of a first type,
the output circuit comprises a second transistor of the first type,
at a beginning of the first edge of the driving signal,
the first transistor is configured to be turned ON to pull a voltage of the driving signal on the first edge from a first voltage toward a second voltage, and
the second transistor is configured to be turned OFF, and
in response to the voltage of the driving signal on the first edge reaching a threshold voltage between the first voltage and the second voltage,
the first transistor is configured to be turned OFF, and
the second transistor is configured to be turned ON to start a second edge of the output signal.

12. The circuit of claim 11, further comprising a resistor, wherein:
the first transistor comprises:
a gate terminal coupled to receive a signal corresponding to the driving signal,
a first terminal configured to be coupled to a first power supply voltage, and
a second terminal coupled to the connection; and
the resistor is coupled between the connection and the first terminal of the first transistor.

13. The circuit of claim 12, wherein:
the second transistor comprises:
a gate terminal coupled to the connection to receive the driving signal,
a first terminal coupled to the output node, and
a second terminal coupled to a second power supply voltage different from the first power supply voltage.

14. The circuit of claim 12, further comprising:
a third transistor of the first type, the third transistor comprising:
a gate terminal coupled to the connection to receive the driving signal,
a first terminal coupled to a second power supply voltage different from the first power supply voltage, and
a second terminal coupled to the gate terminal of the first transistor to provide the signal corresponding to the driving signal to the gate terminal of the first transistor,
wherein the second transistor and the third transistor have different threshold voltages.

15. The circuit of claim 12, wherein:
the signal corresponding to the driving signal is independent from the output signal.

16. A circuit, comprising:
a connection configured to carry a driving signal;
a first transistor of a first type, the first transistor comprising:
a gate terminal coupled to receive a signal corresponding to the driving signal,
a first terminal coupled to the connection, and
a second terminal coupled to a second power supply voltage; and
a second transistor of the first type, the second transistor comprising:
a gate terminal coupled to the connection to receive the driving signal,
a first terminal coupled to a first power supply voltage, and
a second terminal coupled to an output node where an output signal is to be output,
wherein a threshold voltage of the first transistor is different from a threshold voltage of the second transistor.

17. The circuit of claim 16, wherein:
at a beginning of a first edge of the driving signal,
the first transistor is configured to be turned ON, and
the second transistor is configured to be turned OFF,
in response to a voltage of the driving signal on the first edge reaching the threshold voltage of the first transistor,
the first transistor is configured to be turned OFF, and
the second transistor is configured to be turned OFF, and
in response to the voltage of the driving signal on the first edge reaching the threshold voltage of the second transistor,
the first transistor is configured to be turned OFF, and
the second transistor is configured to be turned ON.

18. The circuit of claim 16, further comprising:
a third transistor of the first type, the third transistor comprising:
a gate terminal coupled to the connection to receive the driving signal,
a first terminal coupled to the first power supply voltage, and
a second terminal coupled to the gate terminal of the first transistor to provide the signal corresponding to the driving signal to the gate terminal of the first transistor,
wherein a threshold voltage of the third transistor is different from the threshold voltage of the second transistor.

19. The circuit of claim 18, wherein:
at a beginning of a first edge of the driving signal,
the first transistor is configured to be turned ON,
the second transistor is configured to be turned OFF, and
the third transistor is configured to be turned OFF,
in response to a voltage of the driving signal on the first edge reaching the threshold voltage of the third transistor,
the first transistor is configured to be turned OFF,
the second transistor is configured to be turned OFF, and
the third transistor is configured to be turned ON,
in response to the voltage of the driving signal on the first edge reaching the threshold voltage of the second transistor,
the first transistor is configured to be turned OFF,
the second transistor is configured to be turned ON, and
the third transistor is configured to be turned ON.

20. The circuit of claim 16, wherein:
the signal corresponding to the driving signal is independent from the output signal.

* * * * *